US011098400B2

(12) United States Patent
Strobel et al.

(10) Patent No.: US 11,098,400 B2
(45) Date of Patent: Aug. 24, 2021

(54) MACHINE FOR COATING AN OPTICAL ARTICLE WITH AN ANTI-SOILING COATING COMPOSITION AND METHOD FOR USING THE MACHINE

(71) Applicants: ESSILOR INTERNATIONAL (COMPAGNIE GENERALE D'OPTIQUE), Charenton-le-Pont (FR); SATISLOH PHOTONICS AG, Horgen (CH)

(72) Inventors: Reto Strobel, Zurich (CH); Stephan Scholze, Birmensdorf (CH); Gérald Fournand, Flower Mound, TX (US); Narendra Borgharkar, Dallas, TX (US)

(73) Assignees: Essilor International, Charenton-le-Pont (FR); Satisloh AG, Baar (CH)

( * ) Notice: Subject to any disclaimer, the term of this patent is extended or adjusted under 35 U.S.C. 154(b) by 370 days.

(21) Appl. No.: 15/287,079

(22) Filed: Oct. 6, 2016

(65) Prior Publication Data

US 2017/0022597 A1  Jan. 26, 2017

Related U.S. Application Data

(62) Division of application No. 14/233,213, filed as application No. PCT/IB2012/053624 on Jul. 16, 2012, now abandoned.

(30) Foreign Application Priority Data

Jul. 18, 2011 (EP) .................................... 11305936

(51) Int. Cl.
*C23C 14/02* (2006.01)
*C23C 14/54* (2006.01)
(Continued)

(52) U.S. Cl.
CPC ...... *C23C 14/022* (2013.01); *B29D 11/00865* (2013.01); *C23C 14/12* (2013.01);
(Continued)

(58) Field of Classification Search
CPC ........ B05D 3/142; B05D 3/144; B05D 5/005; B05D 5/08; B05D 5/083; C23C 14/022;
(Continued)

(56) References Cited

U.S. PATENT DOCUMENTS

| 4,573,431 A | 3/1986 | Sarkozy |
| 4,759,948 A | 7/1988 | Hashimoto et al. |

(Continued)

FOREIGN PATENT DOCUMENTS

| CA | 2019211 | 12/1990 |
| WO | 2004/111691 A1 | 12/2004 |
| WO | 2007/051841 A1 | 5/2007 |

OTHER PUBLICATIONS

Chinese Office Action, in corresponding Chinese Patent Application No. 2012800354185.

(Continued)

*Primary Examiner* — Dah-Wei D. Yuan
*Assistant Examiner* — Nga Leung V Law
(74) *Attorney, Agent, or Firm* — Nixon & Vanderhye

(57) ABSTRACT

A machine for coating an optical article with an anti-soiling coating composition, includes a vacuum chamber (8) configured to receive the optical article, a vacuum pump (20) connected to the vacuum chamber (8), a plasma generator (11) configured to carry out a vacuum plasma treatment of the optical article, an evaporation device (10) configured to carry out a vacuum evaporation treatment of the composition for depositing it on the optical article, a control unit (2) controlling the plasma generator for removing an initial outermost anti-soiling coating of the article, controlling the (Continued)

evaporation device for recoating the article with the anti-soiling coating composition, being configured to causes the vacuum pump (20) to suck gases from the chamber (8) during vacuum plasma treatment and being further configured to causes the vacuum pump (20) not to suck gases from the chamber (8) during vacuum evaporation treatment.

16 Claims, 3 Drawing Sheets

(51) Int. Cl.
- C23C 14/56 (2006.01)
- C23C 14/12 (2006.01)
- C23C 14/24 (2006.01)
- B29D 11/00 (2006.01)
- H01J 37/32 (2006.01)

(52) U.S. Cl.
CPC .............. *C23C 14/24* (2013.01); *C23C 14/54* (2013.01); *C23C 14/56* (2013.01); *H01J 37/32458* (2013.01); *H01J 2237/334* (2013.01)

(58) Field of Classification Search
CPC ......... C23C 14/12; C23C 14/24; C23C 14/54; C23C 14/56; H01J 37/23458; H01J 2237/334; H01J 37/32458; B29D 11/00865; B29D 11/00009
USPC ....... 427/140, 534, 527, 562, 563, 578–579, 427/588, 589, 162–167; 216/24, 25, 26, 216/67–71; 118/692, 663
See application file for complete search history.

(56) References Cited

U.S. PATENT DOCUMENTS

| | | | |
|---|---|---|---|
| 4,999,215 A | 3/1991 | Akagi et al. | |
| 5,423,936 A | 6/1995 | Tomita et al. | |
| 6,020,035 A | 2/2000 | Gupta et al. | |
| 6,153,529 A * | 11/2000 | Agarwal | C23C 16/452 216/66 |
| 6,500,501 B1 * | 12/2002 | Akram | C23C 16/42 427/255.28 |
| 7,192,626 B2 * | 3/2007 | Dussarrat | C23C 16/308 257/E21.269 |
| 7,647,886 B2 * | 1/2010 | Kubista | C23C 16/4412 118/663 |
| 8,082,756 B2 * | 12/2011 | Conte | B24B 9/146 451/390 |
| 8,709,588 B2 * | 4/2014 | Cadet | C03C 17/30 428/304.4 |
| 8,945,684 B2 * | 2/2015 | Fournand | C09D 5/1662 427/164 |
| 2004/0253369 A1 | 12/2004 | Jallouli et al. | |
| 2005/0008784 A1 | 1/2005 | Martin et al. | |
| 2005/0106891 A1 * | 5/2005 | Polinsky | H01L 21/31138 438/729 |
| 2007/0104891 A1 | 5/2007 | Fournand | |
| 2007/0141358 A1 * | 6/2007 | Jallouli | B24B 9/146 428/426 |
| 2008/0171147 A1 | 7/2008 | Singh | |
| 2008/0257264 A1 | 10/2008 | Petersen | |
| 2009/0098186 A1 * | 4/2009 | Kirkpatrick | B05B 5/08 424/424 |
| 2010/0083898 A1 * | 4/2010 | Kogura | C23C 16/405 118/692 |
| 2010/0200541 A1 * | 8/2010 | Habassi | B24B 9/14 216/26 |
| 2010/0298738 A1 * | 11/2010 | Felts | B05D 1/62 600/576 |
| 2011/0033635 A1 * | 2/2011 | Nishimoto | B29D 11/00865 427/551 |
| 2011/0126762 A1 | 6/2011 | Faguet et al. | |
| 2012/0019767 A1 * | 1/2012 | Cadet | C03C 17/30 351/62 |
| 2015/0309216 A1 * | 10/2015 | Fournand | C08J 7/123 427/536 |
| 2015/0360247 A1 * | 12/2015 | Fournand | B29D 11/00865 427/534 |
| 2017/0282470 A1 * | 10/2017 | Shan | B29D 11/00009 |
| 2018/0215114 A1 * | 8/2018 | Glacet | B29D 11/00865 |

OTHER PUBLICATIONS

International Search Report, dated Oct. 23, 2012, from corresponding PCT application.

* cited by examiner

MACHINE FOR COATING AN OPTICAL ARTICLE WITH AN ANTI-SOILING COATING COMPOSITION AND METHOD FOR USING THE MACHINE

FIELD OF THE INVENTION

The invention relates to machines for coating an optical article such as an ophthalmic lens, and in particular spectacle lenses preferably mounted on a spectable frame, with an anti-soiling coating composition.

The invention further relates to a method for using such a machine.

BACKGROUND ART

It is well known that lenses, and in particular spectacle lenses, comprise an ophthalmic substrate having geometrical features adapted to the wearer.

The ophthalmic substrate requires the adding of coatings, for instance an anti-abrasive coating to increase the abrasion resistance of the lens, an anti-reflective coating to decrease the reflection of light and an anti-soiling coating applied over the anti-reflective coating. The anti-soiling coating provides an outer coating that can be more resistant to contamination for instance by organic impurities and more easily cleaned than the anti-reflective coating. The anti-soiling coating furthermore protects the anti-reflective coating.

The wearer of the lens can wish to replace such an anti-soiling coating because the effects of said coating can decrease over time.

One known method to remove the first anti-soiling coating and replace it by a second anti-soiling coating is described in US patent application US 2005/0008784, in which a low pressure plasma treatment is carried out to remove the first anti-soiling coating initially coated on the lens. Next, the second anti-soiling coating (the new one) is coated on the lens for instance by wiping with a woven or non-woven fabric, spraying, casting, rolling or immersing the lens. Thus, the first anti-soiling coating is removed and replaced by the second anti-soiling coating.

Such a method is also known from the International patent application WO 2004/111691 in which an activation treatment of technical species at about atmospheric pressure is carried out, in particular a corona discharge treatment or a plasma treatment, for removing an initial outermost coating layer of a coated optical lens. Next, a final coating, in particular an anti-soiling coating, is deposited on the lens by vacuum, dip, spin, spray or stamping coating. Thus, the initial outermost coating of the lens is removed and replaced by an anti-soiling coating.

The International patent application WO 2007/051841 describes a semi-finished lens substrate having a first coated layer referred to as an anti-reflective coating which is deposited by evaporation in a vacuum chamber and having a second coated layer referred to as an anti-soiling coating which is also deposited by evaporation in a vacuum chamber. It is necessary to carry out a pre-treatment before the depositing of the anti-soiling coating on the anti-reflective coating. The pre-treatment is an energetic treatment required to activate the adherence properties of the anti-reflective coating. The energetic treatment is a vacuum plasma treatment. The anti-soiling coating is made from a liquid composition which also needs to be activated by vacuum plasma treatment. The activation of the anti-reflective coating and the liquid composition can be made in the same vacuum chamber of a known vacuum treating machine provided with a pump. The vacuum evaporation of the liquid composition is made via an evaporation device associated with the vacuum treating machine, the evaporation device comprising an elongated piece of steel wool connected on both sides to an electrical circuit.

The invention is directed to a machine for coating or recoating an optical article with an anti-soiling coating composition, which machine is simple to implement, compact and economic.

SUMMARY OF THE INVENTION

The invention accordingly provides a machine for coating an optical article with an anti-soiling coating composition, comprising:
- a vacuum chamber having an interior space configured to receive the optical article;
- a vacuum pump connected to the vacuum chamber;
- a plasma generator configured to carry out a vacuum plasma treatment of the optical article in the vacuum chamber;
- an evaporation device configured to carry out a vacuum evaporation treatment of the anti-soiling coating composition for depositing it on the optical article in the vacuum chamber; and
- a control unit configured to control both the plasma generator and the evaporation device;
- the control unit controlling the plasma generator for removing an initial outermost anti-soiling coating of the optical article;
- the control unit controlling the evaporation device for recoating the optical article with the anti-soiling coating composition;
- the control unit being further configured to causes the vacuum pump to suck gases from the vacuum chamber during vacuum plasma treatment; and
- the control unit being further configured to causes the vacuum pump not to suck gases from the vacuum chamber during vacuum evaporation treatment.

In other words, the machine according to the invention is configured for recoating the optical article first by removing the initial outermost anti-soiling coating and next by depositing a new anti-soiling coating on the optical article.

The two distinct treatments are implemented in the same vacuum chamber of the machine so that the machine is simple and economic.

A vacuum pump is used to obtain the vacuum in the chamber. The vacuum pump which is first connected (a flow connection causing the pump to suck) to the vacuum chamber is then disconnected (a flow interruption causing the pump not to suck) between the two treatments successively carried out so that the quality of the vacuum evaporation treatment is increased.

Because the plasma treatment is a treatment which requires an agitated state and the evaporation treatment is a treatment which requires a quiet state, a vacuum plasma chamber is generally inconsistent with evaporation treatment due to the gas flow needed during the plasma treatment. The invention assumes that it is actually possible to have a quiet state in the vacuum plasma chamber by causing the vacuum pump not to suck gases from the vacuum chamber.

The machine further comprises a data processing system which is configured to control both and successively the plasma generator and the evaporation device so that the machine is particularly simple both to make and to use.

Furthermore, the machine according to the invention is compact. Thus, the machine according to the invention can be placed at an optician's premises, the optician being easily able to use said machine.

Due to the fact that only one machine comprises all the elements needed for removing the initial anti-soiling coating and for recoating the optical article with the anti-soiling coating composition, it is also very convenient for the optician and the recoating is very fast.

According to features preferred as being very simple, convenient and economical for embodying the machine according to the invention:
- the machine comprises a vacuum valve disposed between the vacuum chamber and the vacuum pump and configured to be in an open state and in an close state respectively for causing the vacuum pump to suck and not to suck gases from the vacuum chamber;
- the vacuum pump is configured to be put on and put off respectively for sucking or not sucking gases from the vacuum chamber;
- the machine comprises a pressure sensor disposed between the vacuum chamber and the vacuum pump;
- the machine comprises a filtering device and the control unit is configured to causing the vacuum pump to suck gases from the vacuum chamber and exhaust gases to atmosphere by passing through the filtering device;
- the filtering device is disposed between the vacuum chamber and the vacuum pump;
- the machine comprises a gas inlet valve connected to the vacuum chamber;
- the evaporation device comprises a heating module configured to heat the anti-soiling coating composition;
- the machine comprises a crucible configured to receive the anti-soiling coating composition, the heating module comprising a first support on which the crucible is received;
- the machine comprises a second support on which the optical article is received;
- the machine comprises a door which is moveable or removable, the evaporation device and the second support being received on the door;
- the vacuum chamber is configured to receive spectacle lenses mounted on a spectacle frame and the machine is configured to recoat the spectacle lenses;
- the control unit comprises a data processing system having a microprocessor and a random access memory and being configured to load and execute a computer program for controlling both and successively the plasma generator and the evaporation device; and/or
- the control unit comprises a communication interface configured to communicate with the data processing system for recoating the optical article.

The invention also provides a method for using such a machine as described above, comprising the steps of:
- selecting an optical article having an initial outermost anti-soiling coating;
- loading the optical article into the vacuum chamber of the machine;
- loading the anti-soiling coating composition into the vacuum chamber;
- starting the vacuum pump of the machine and causing the vacuum pump to suck gases from the vacuum chamber;
- carrying out the vacuum plasma treatment and controlling it for removing the initial outermost anti-soiling coating of the optical article;
- causing the vacuum pump not to suck gases from the vacuum chamber;
- carrying out the vacuum evaporation treatment and controlling it for recoating the optical article with the anti-soiling coating composition; and
- unloading the optical article from the vacuum chamber.

Like the machine according to the invention, the method using the machine is particularly simple, convenient and fast to implement.

According to features preferred as being very simple, convenient and economical for embodying the method according to the invention:
- the machine comprises a vacuum valve disposed between the vacuum chamber and the vacuum pump and the steps of causing the vacuum pump to suck and not to suck respectively comprise the steps of opening and closing the vacuum valve;
- the machine comprises a filtering device connected to the vacuum chamber and the method further comprises the step of filtering the gases before exhausting to atmosphere when the vacuum pump is causing to suck gases from the vacuum chamber;
- the method comprises the step of causing the vacuum pump to suck the gases from the vacuum chamber before the step of filtering the gases and the step of causing the vacuum pump not to suck gases from the vacuum chamber after the step of filtering the gases;
- the machine comprises a gas inlet valve connected to the vacuum chamber and the method comprises, before the step of carrying out the vacuum plasma treatment, the step of opening the gas inlet valve;
- the step of carrying out the vacuum evaporation treatment comprises the step of heating the anti-soiling coating composition for a predetermined time; and/or
- the machine comprises a crucible configured to receive the anti-soiling coating composition and the step of heating the anti-soiling coating composition is carried out by heating the crucible.

BRIEF DESCRIPTION OF THE DRAWINGS

The description of the invention now continues with a detailed description of a preferred embodiment given hereinafter by way of non-limiting example and with reference to the appended drawings. In these drawings.

DETAILED DESCRIPTION OF PREFERRED EMBODIMENTS

Figure 1:
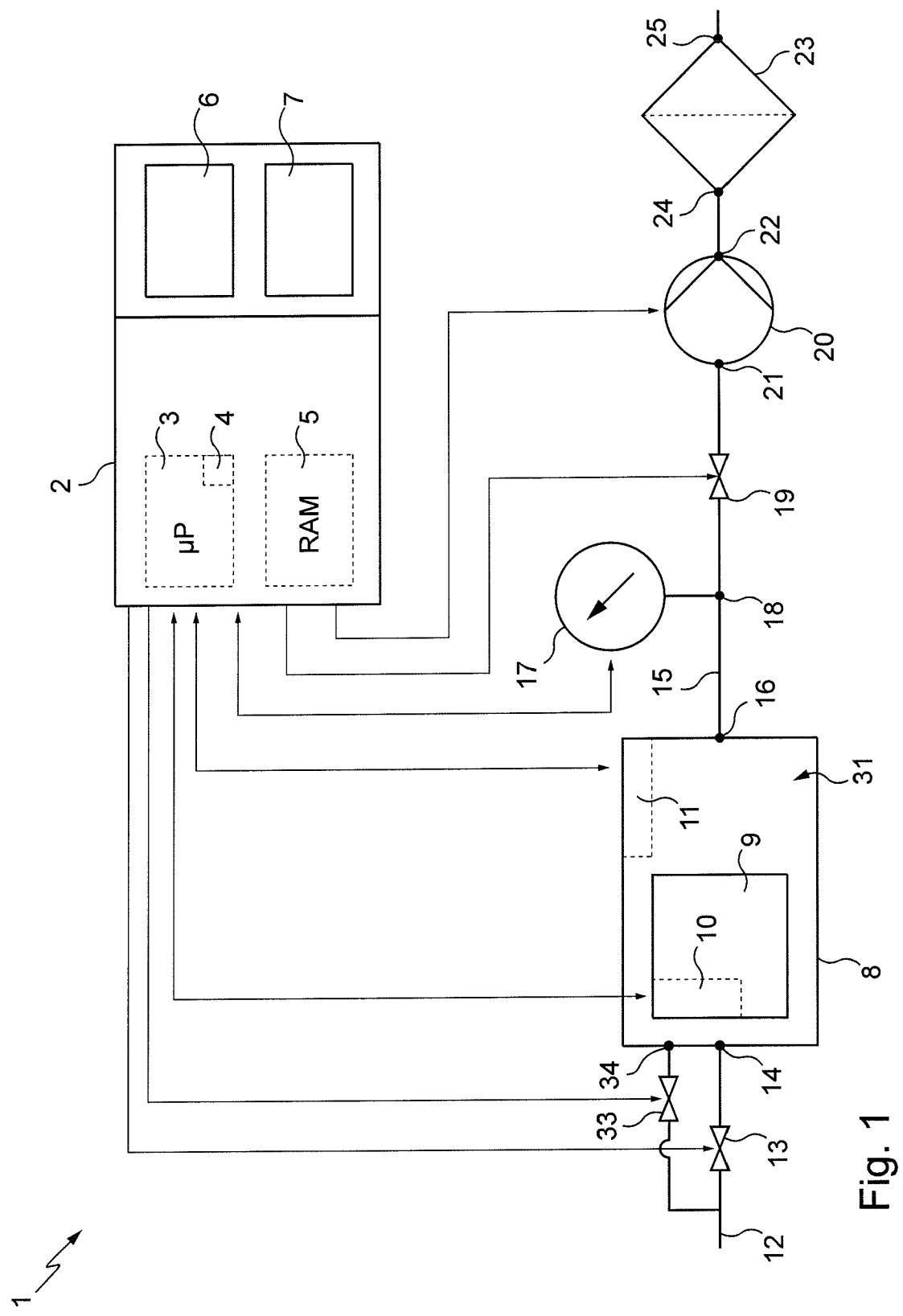
FIG. 1 is a schematic view of a machine for coating according to the invention.

FIG. 1 shows a recoat treatment machine 1 for recoating an optical article 28 formed here by spectacle lenses mounted on a spectacle frame.

The machine 1 comprises a vacuum chamber 8, a plasma generator 11, an evaporation device 10, an inlet circuit 12, an outlet circuit 15, a vacuum pump 20 and a control unit 2.

The vacuum chamber 8 comprises an interior space 31 configured to receive the spectacle lenses 28 mounted on a spectacle frame.

The vacuum chamber 8 further comprises a door 9 which is removable (see description of FIGS. 2 and 3 below).

The plasma generator 11 is directly connected to the vacuum chamber 8.

The plasma generator 11 generally comprises a high-frequency generator.

The evaporation device 10 is placed in the vacuum chamber 8 (i.e. mounted on the door 9 of the vacuum chamber 8) (see below).

The vacuum chamber 8 further comprises a first inlet port 14 and a second inlet port 34 both connected to the inlet circuit 12.

The machine further comprises a gas inlet valve 13 mounted on said inlet circuit 12 and an inlet valve 33 which is also mounted on said inlet circuit 12, parallel to the inlet valve 13.

The vacuum chamber 8 further comprises an outlet port 16 connected to the outlet circuit 15.

The vacuum pump 20 is connected to the outlet circuit 15 via an admission port 21 of the vacuum pump 20 and via an exit port 22 of said vacuum pump 20 so that the outlet circuit 15 passes through the vacuum pump 20.

The machine 1 further comprises a pressure sensor 17 which is connected to the outlet circuit 15 via a branching point 18.

The machine 1 further comprises a vacuum valve 19 which is mounted on the outlet circuit 15, between the branching point 18 and the admission port 21 of the vacuum pump 20.

The machine 1 further comprises a filtering device 23 here formed by a gas filter.

Said filtering device 23 is connected to the outlet circuit 15 via an entrance port 24 and via an exhaust port 25 of said filtering device 23.

The exhaust port 25 is linked to the atmosphere.

Said filtering device 23 is thus mounted at the end of the outlet circuit 15, after the vacuum pump 20.

The control unit 2 comprises a data processing system comprising a microprocessor 3 having a memory 4, in particular non volatile, allowing a software application, in other words a computer program, to be loaded and stored therein, and which allows the method for recoating the spectacle lenses 28 to be carried out when it is executed in the microprocessor 3.

Said non volatile memory is for instance a read only memory.

The data processing system further comprises a memory 5, for instance volatile, allowing storage of data during the execution of the software and the implementation of the method.

Said volatile memory 5 is for instance a random access memory or an electrically erasable programmable read only memory.

The control unit 2 further comprises a communication interface configured to communicate with the data processing system.

Said communication interface is here formed by a graphic interface 6 and a keyboard 7.

The control unit 2 is configured to control and exchange data with the gas inlet valve 13, the evaporation device 10, the plasma generator 11, the pressure sensor 17, the vacuum valve 19 and the vacuum pump 20.

Figure 2:
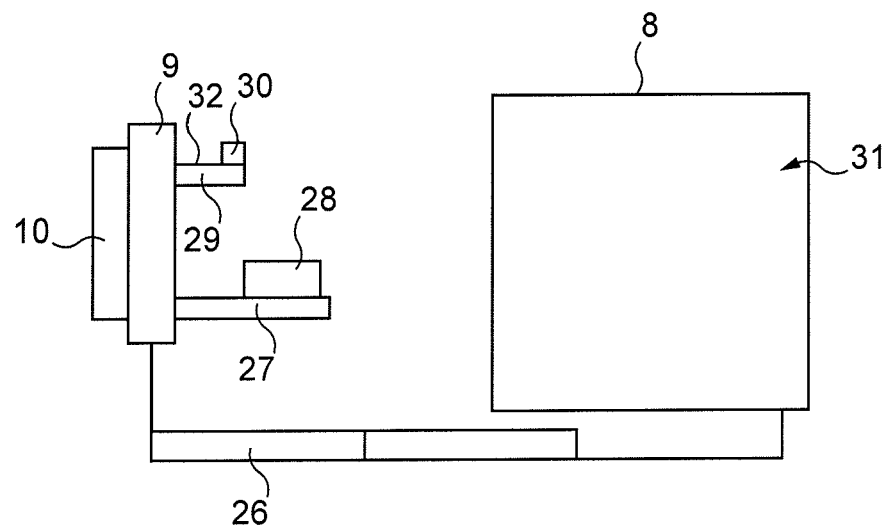
FIGS. 2 and 3 are partially schematic views of the machine showing a vacuum chamber of the machine with its door which is respectively open and closed.
Figure 3:
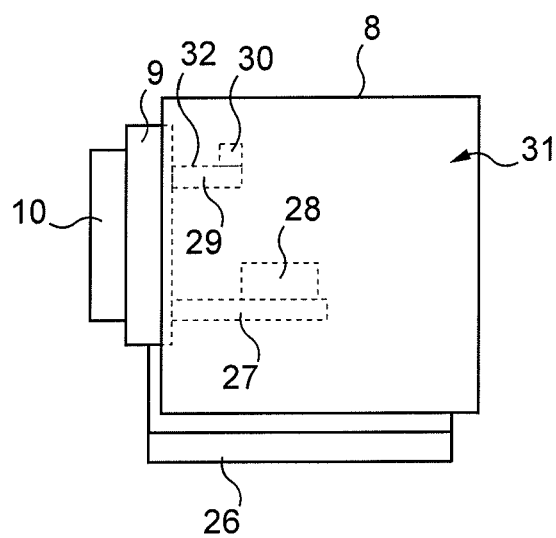
Figure 4:
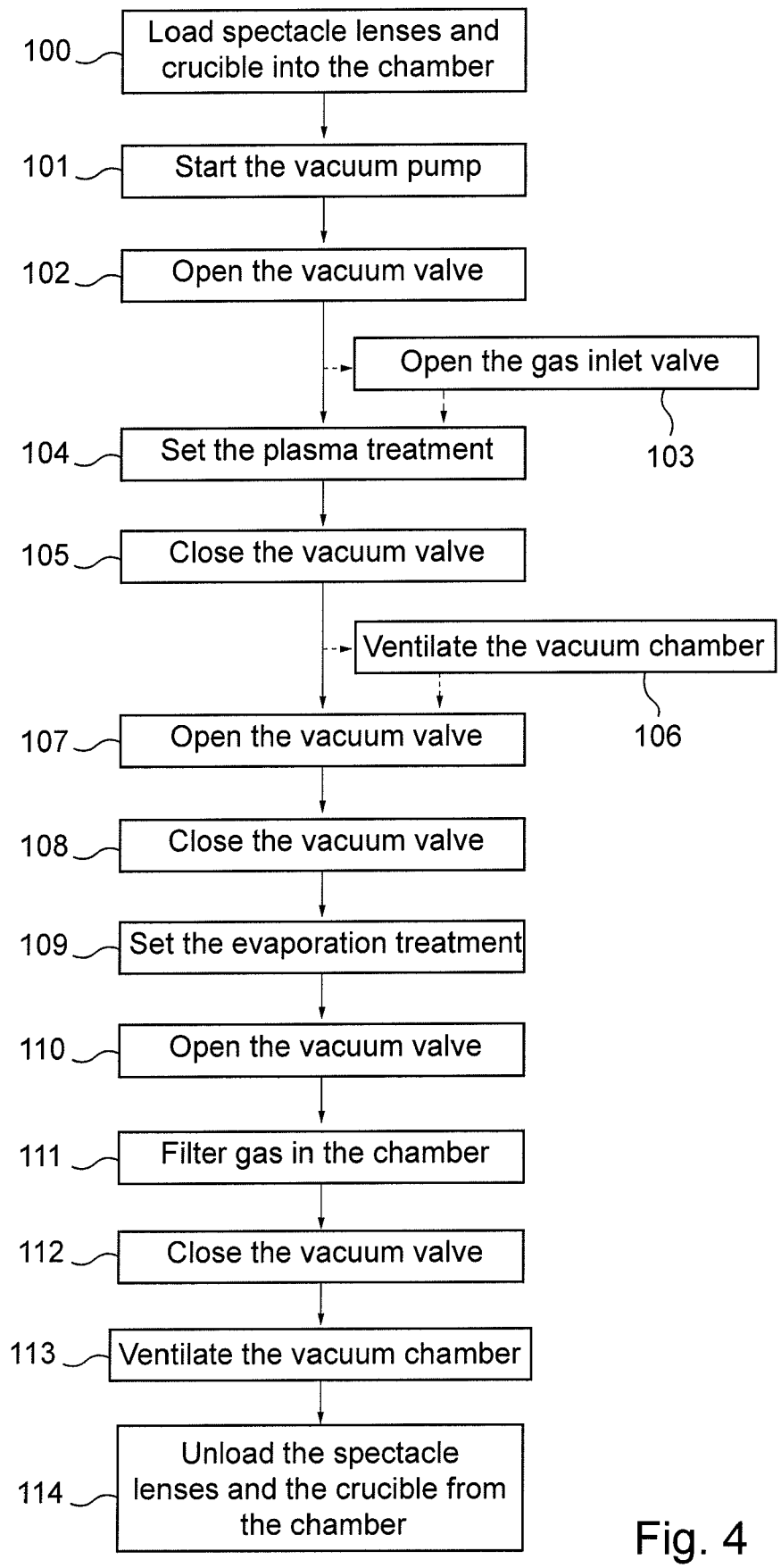
FIG. 4 is a block diagram illustrating steps for using the machine for recoating an optical article.

FIGS. 2 and 3 show in detail the vacuum chamber 8 and its removable door 9 respectively in an open state and in a closed state.

The vacuum chamber 8 comprises a displacement member 26 configured for sliding the door 9 between its open and closed states.

The machine 1 further comprises a first support 29 mounted on the interior face of the door 9.

Said first support 29 is configured to receive a crucible 30 which is configured to be imbibed with an anti-soiling coating liquid composition.

The first support 29 forms part of the evaporation device 10.

The evaporation device 10 is here formed by a heating module 32 mounted on the interior face of the door 9, connected both to the first support 29 and to a power supply source (not shown) in order to heat the anti-soiling coating composition via the crucible 30 and via the first support 29.

The machine 1 further comprises a second support 27 also mounted on the interior face of the door 9.

Said second support 27 is configured to receive the spectacle lenses 28 mounted on the spectacle frame.

The open state of the door 9 enables loading of the crucible 30 imbibed with the anti-soiling coating composition on the first support 29 and the spectacle lenses 28 together with the spectacle frame on the second support 27.

When the crucible 30 and the spectacle lenses 28 are received on their respective support 29, 27, the door 9 can be moved from its open state to its closed state as shown on FIG. 3.

In this closed state of the door 9, the spectacle lenses 28 together with the spectacle frame and the crucible 30 imbibed with the anti-soiling coating composition are in the vacuum chamber 8.

In a convenient way, the machine 1 is thus configured to be provided to an optician who can use said machine 1 when the wearer of the spectacle lenses 28 comes in his shop.

The spectacle lenses 28 generally comprise an ophthalmic lens substrate on which are coated firstly an anti-reflective coating layer and secondly an initial anti-soiling coating layer.

If the effects of the initial anti-soiling layer are decreased, which is generally the case after few months of wearing, the optician can recoat a new anti-soiling layer on the spectacle lenses 28.

We will now describe in details the method for using the machine 1 in order to recoat the spectacle lenses 28 with an anti-soiling coating composition.

For that, the optician takes the spectacle lenses 28 (step of selecting the optical article) and selects the adapted anti-soiling composition to recoat.

The optician opens the door 9 of the vacuum chamber 8 and at step 100 loads the spectacle lenses 28 and the crucible 30 on the second support 27 and on the first support 29, respectively.

The crucible 30 has previously been imbibed with a predetermined volume of the new anti-soiling coating composition.

The optician closes the door 9 of the vacuum chamber 8.

Next, the optician starts the treatment program for recoating the spectacle lenses 28 via the keyboard 7 and the graphic interface 6.

The control unit 2 then takes over the recoat treatment.

The vacuum pump 20 is started at step 101 and the vacuum valve 19 is opened at step 102 in order to connect (a flow connection) the vacuum pump 20 to the vacuum chamber 8 for evacuating the interior space 31 of the vacuum chamber 8 via the outlet circuit 15. The vacuum pump 20 is thus able to suck the gases from the vacuum chamber 8.

The control unit 2 waits and takes pressure measurements via the pressure sensor 17 until the vacuum chamber pressure reaches about 0.3-0.35 mbar.

Optionally the gas inlet valve 13 is then opened in order to allow gas to enter in the vacuum chamber 8 via the inlet circuit 12 to have a stable pressure in the vacuum chamber 8.

The gas is here atmospheric air.

The evacuation time of the vacuum chamber 8 is approximately 120 s.

The plasma generator 11 is then set at step 104 with a predetermined power and a predetermined time in order to carry out the vacuum plasma treatment for removing the initial outermost anti-soiling coating on the spectacle lenses 28, the effects of which having decreased.

Here, the plasma generator power is about 50-200W (5-20 W/L according to the volume of the vacuum chamber 8 which is here 10L) and the time of the plasma treatment is approximately equal to 60 s.

The vacuum plasma treatment allows removal of all the initial outermost coating of the spectacle lenses 28 without damaging the anti-reflective coating.

Further, the plasma treatment allows activation of the surface of the spectacle lenses 28, in particular the anti-reflective coating in order to increase the adherence properties.

The vacuum valve 19 is then closed at step 105 in order to disconnect (a flow interruption) the vacuum pump 20 from the vacuum chamber 8. The vacuum pump 20 is thus able not to suck the gases from the vacuum chamber 8.

During the plasma treatment, the gases sucked by the vacuum pump 20 are filtered by the filtering device 23 before exhausting to the atmosphere.

At this stage of the recoat treatment, the control unit 2 optionally implements a venting step 106, depending on the required pressure for evaporation.

At step 106, the inlet valve 33 is opened for a predetermined time, for instance 10-20 s, in order to vent the vacuum chamber 8 and raise the pressure in the chamber 8.

The inlet valve 33 is then closed to end the venting step 106.

Next, the vacuum valve 19 is opened at step 107 in order to reconnect (a flow connection) the vacuum pump 20 to the vacuum chamber 8 for evacuating said vacuum chamber 8. The vacuum pump 20 is thus able to suck the gases from the vacuum chamber 8.

The vacuum valve 19 is opened for a predetermined time, for instance about 20 s, until the vacuum chamber pressure reaches a required pressure for evaporation, for instance about 50 mbar.

The control unit 2 is configured to control the pressure in the vacuum chamber 8 by taking measurements with the pressure sensor 17.

The vacuum valve 19 is then closed at step 108 in order to disconnect (a flow interruption) the vacuum pump 20 from the vacuum chamber 8. The vacuum pump 20 is thus able not to suck the gases from the vacuum chamber 8.

The heating module 32 of the evaporation device 11 is then setting at step 109 for a predetermined time at a predetermined current in order to reach a predetermined temperature of the heating module 32.

The predetermined time is about 30-50 s and the predetermined heating temperature is about 350° C. Heat load time and temperature are dependant on evaporation pressure and precursor used.

The heat of the heating module 32 is at least partially transferred to the crucible 30 and thus to the anti-soiling coating liquid composition which is imbibed.

Then, the heating step is stopped and the evaporation treatment continues (step 109) for a predetermined time which is for instance equal to 60-180 s.

During the evaporation treatment, the anti-soiling coating composition is evaporated in the vacuum chamber 8 and the vapour is deposited on the spectacle lenses 28.

Next, the vacuum valve 19 is opened at step 110 in order to reconnect (a flow connection) the vacuum pump 20 to the vacuum chamber 8 for evacuating said vacuum chamber 8, and in particular for evacuating the gases emitted during the vacuum evaporation treatment because such gases might be toxic. The vacuum pump 20 is thus able to suck the gases from the vacuum chamber 8.

The gases are sent from the vacuum pump 20 to the filtering device 23 where the gases are filtered at step 111.

The filtering step 111 is carried out for a predetermined time, for instance about 120 s.

The vacuum valve 19 is then closed at step 112 so that the vacuum pump 20 is disconnected (a flow interruption) from the vacuum chamber 8. The vacuum pump 20 is thus able not to suck the gases from the vacuum chamber 8.

As in step 106, a venting step 113 is carried out equilibrating the chamber pressure with atmospheric pressure. The venting step 113 is identical to the venting step 106.

The gas inlet valve 33 is opened for a predetermined time, for instance 60 s, in order to vent the vacuum chamber 8 and the gas inlet valve 13 is then closed.

The recoat treatment is thus finished after a time of approximately 10-20 min.

The optician opens the door 9 of the vacuum chamber 8.

There is no risk because all the toxic gases have been filtered and the air during the treatment has been exhausted.

The anti-soiling coating composition has been consumed.

At step 114 the optician unloads the crucible 30, and also the spectacle lenses 28 which are recoated with a new anti-soiling coating.

The crucible 30 is in fact a disposable product.

The machine 1 and the method for using said machine 1 are thus very convenient, simple and economic.

In variant, the vacuum valve is not used to causing the vacuum pump to suck or not to suck gases from the vacuum chamber, but rather the control unit is configured to directly put on and put off the vacuum pump (flow connection and flow interruption).

In variants that are not illustrated:
- the first and second supports are not disposed on the door of the vacuum chamber, but rather directly in the vacuum chamber and the evaporation device, in particular the heating module, is thus not disposed on the door but also in the vacuum chamber;
- the filtering device is not disposed after the vacuum pump, but rather between the vacuum pump and the vacuum chamber;
- the crucible is not formed as a porous member which is imbibed with the new anti-soiling coating liquid composition, but rather as a receptacle into which the new anti-soiling coating liquid composition is poured;
- the crucible is not loaded at the same time as the spectacle lenses (before the vacuum plasma treatment), but rather after the plasma treatment and before the evaporation treatment;
- the pressure sensor is not connected to the outlet circuit via a branching point, but rather the pressure sensor is directly connected to the vacuum chamber; and/or
- the values of pressure, temperature and time are different, for instance the plasma treatment pressure is about 0.1-1 mbar rather than 0.3-0.35 mbar, the evaporation treatment pressure is about 1-1000 mbar rather than 50 mbar and the heating temperature is about 200-500° C. rather than 350° C.

It should be noted more generally that the invention is not limited to the examples described and represented.

The invention claimed is:

1. A method for using a machine for coating an optical article with an anti-soiling coating composition, the machine including a vacuum chamber having an interior space configured to receive the optical article, a vacuum pump connectable to the vacuum chamber, a plasma generator configured to carry out a vacuum plasma treatment of the optical article in the vacuum chamber, an evaporation device configured to carry out a vacuum evaporation treatment of the anti-soiling coating composition for depositing the anti-soiling coating composition on the optical article in the vacuum chamber, and a control unit configured to control both the plasma generator and the evaporation device, the method comprising the following steps in order:
   selecting the optical article having an initial outermost anti-soiling coating;
   loading the optical article into the vacuum chamber of the machine;
   loading the anti-soiling coating composition into the vacuum chamber;
   starting operation of the vacuum pump of the machine by connecting the vacuum pump to the vacuum chamber to evacuate the interior space of the vacuum chamber to cause the vacuum pump to suck gases from the vacuum chamber;
   carrying out the vacuum plasma treatment with the plasma generator and controlling the plasma generator with the control unit to remove the initial outermost anti-soiling coating of the optical article;
   disconnecting the vacuum pump from the vacuum chamber so that the vacuum pump is not able to suck gases from the vacuum chamber;
   reconnecting the vacuum pump to the vacuum chamber to evacuate the vacuum chamber, for a predetermined amount of time, until a vacuum chamber pressure reaches a required pressure for evaporation, the vacuum chamber pressure being monitored by a pressure sensor;
   disconnecting the vacuum pump from the vacuum chamber after the vacuum chamber pressure reaches the required pressure for evaporation;
   carrying out the vacuum evaporation treatment with the evaporation device by heating the anti-soiling coating composition such that the anti-soiling coating composition is evaporated in the vacuum chamber to recoat the optical article with the anti-soiling coating composition; and
   unloading the optical article from the vacuum chamber.

2. The method according to claim 1, wherein the machine further includes a vacuum valve disposed between the vacuum chamber and the vacuum pump, and
   the method further comprises opening and closing the vacuum valve to cause the vacuum pump to respectively suck and not suck.

3. The method according to claim 1, wherein the machine includes a filtering device connected to the vacuum chamber, and
   the method further comprises, after carrying out the vacuum evaporation treatment,
      further reconnecting the vacuum pump to the vacuum chamber and providing gases sucked from the vacuum chamber to the filtering device; and
      filtering the gases at the filtering device.

4. The method according to claim 3, further comprising further disconnecting the vacuum pump from the vacuum chamber after the filtering.

5. The method according to claim 1, wherein the machine includes a gas inlet valve connected to the vacuum chamber, and
   the method further comprises, before the carrying out the vacuum plasma treatment, opening the gas inlet valve.

6. The method according to claim 1, wherein the carrying out the vacuum evaporation treatment comprises heating the anti-soiling coating composition for a predetermined time.

7. The method according to claim 6, wherein the machine includes a crucible configured to receive the anti-soiling coating composition, and
   the heating of the anti-soiling coating composition is carried out by heating the crucible.

8. A method for recoating an optical article with an anti-soiling coating composition, the method comprising the following steps in order:
   selecting the optical article having an initial outermost anti-soiling coating;
   loading the optical article into a vacuum chamber of a machine for coating;
   loading the anti-soiling coating composition into the vacuum chamber;
   starting operation of a vacuum pump of the machine by connecting the vacuum pump to the vacuum chamber to evacuate an interior space of the vacuum chamber to cause the vacuum pump to suck gases from the vacuum chamber;
   carrying out a vacuum plasma treatment with a plasma generator and controlling the plasma generator to remove the initial outermost anti-soiling coating of the optical article;
   disconnecting the vacuum pump from the vacuum chamber so that the vacuum pump is not able to suck gases from the vacuum chamber;
   reconnecting the vacuum pump to the vacuum chamber to evacuate the vacuum chamber, for a predetermined amount of time, until a vacuum chamber pressure reaches a required pressure for evaporation, the vacuum chamber pressure being monitored by a pressure sensor;
   disconnecting the vacuum pump from the vacuum chamber after the vacuum chamber pressure reaches the required pressure for evaporation;
   carrying out a vacuum evaporation treatment with an evaporation device by heating the anti-soiling coating composition such that the anti-soiling coating composition is evaporated in the vacuum chamber to recoat the optical article with the anti-soiling coating composition; and
   unloading the optical article from the vacuum chamber.

9. The method according to claim 2, wherein the machine includes a filtering device connected to the vacuum chamber, and
   the method further comprises, after carrying out the vacuum evaporation treatment,
      further reconnecting the vacuum pump to the vacuum chamber and providing gases sucked from the vacuum chamber to the filtering device; and
      filtering the gases at the filtering device.

10. The method according to claim 2, wherein the machine includes a gas inlet valve connected to the vacuum chamber, and the method further comprises, before the carrying out the vacuum plasma treatment, opening the gas inlet valve.

11. The method according to claim 2, wherein the carrying out the vacuum evaporation treatment comprises heating the anti-soiling coating composition for a predetermined time.

12. The method according to claim 1, further comprising a vacuum valve mounted on an outlet between a branching point connected to the pressure sensor and an admission port of the vacuum pump,
wherein the vacuum pump is connected to the vacuum chamber by opening the vacuum valve,
the vacuum pump is disconnected from the vacuum chamber by closing the vacuum valve, and
the vacuum pump is reconnected to the vacuum chamber by opening the vacuum valve.

13. A method for using a machine for coating an optical article with an anti-soiling coating composition, the machine including a vacuum chamber having an interior space configured to receive the optical article, a vacuum pump connectable to the vacuum chamber, a plasma generator configured to carry out a vacuum plasma treatment of the optical article in the vacuum chamber, an evaporation device configured to carry out a vacuum evaporation treatment of the anti-soiling coating composition for depositing the anti-soiling coating composition on the optical article in the vacuum chamber, and a control unit configured to control both the plasma generator and the evaporation device, the method comprising the following steps in order:
selecting the optical article having an initial outermost anti-soiling coating;
loading the optical article into the vacuum chamber of the machine;
loading the anti-soiling coating composition into the vacuum chamber;
starting operation of the vacuum pump of the machine by connecting the vacuum pump to the vacuum chamber to evacuate the interior space of the vacuum chamber to cause the vacuum pump to suck gases from the vacuum chamber;
carrying out the vacuum plasma treatment with the plasma generator and controlling the plasma generator with the control unit to remove the initial outermost anti-soiling coating of the optical article, the gases sucked by the vacuum pump being filtered by a filtering device;
disconnecting the vacuum pump from the vacuum chamber so that the vacuum pump is not able to suck gases from the vacuum chamber;
reconnecting the vacuum pump to the vacuum chamber to evacuate the vacuum chamber, for a predetermined amount of time, until a vacuum chamber pressure reaches a required pressure for evaporation, the vacuum chamber pressure being monitored by a pressure sensor;
disconnecting the vacuum pump from the vacuum chamber after the vacuum chamber pressure reaches the required pressure for evaporation;
carrying out the vacuum evaporation treatment with the evaporation device by heating the anti-soiling coating composition such that the anti-soiling coating composition is evaporated in the vacuum chamber to recoat the optical article with the anti-soiling coating composition;
reconnecting the vacuum pump to the vacuum chamber to evacuate gases emitted during the vacuum evaporation treatment from the vacuum chamber to the filtering device;
filtering the gases emitted during the vacuum evaporation treatment at the filtering device;
disconnecting the vacuum pump from the vacuum chamber after the filtering; and
unloading the optical article from the vacuum chamber,
wherein the vacuum chamber pressure for the required pressure for evaporation is different from a vacuum chamber pressure required for the plasma treatment.

14. The method according to claim 13, wherein the vacuum chamber pressure for the required pressure for evaporation is higher than the vacuum pressure required for the plasma treatment.

15. A method for recoating an optical article with an anti-soiling coating composition, the method comprising the following steps in order:
selecting the optical article having an initial outermost anti-soiling coating;
loading the optical article into a vacuum chamber of a machine for coating;
loading the anti-soiling coating composition into the vacuum chamber;
starting operation of a vacuum pump of the machine by connecting the vacuum pump to the vacuum chamber to evacuate an interior space of the vacuum chamber to cause the vacuum pump to suck gases from the vacuum chamber;
carrying out a vacuum plasma treatment with a plasma generator and controlling the plasma generator to remove the initial outermost anti-soiling coating of the optical article, the gases sucked by the vacuum pump being filtered by a filtering device;
disconnecting the vacuum pump from the vacuum chamber so that the vacuum pump is not able to suck gases from the vacuum chamber;
reconnecting the vacuum pump to the vacuum chamber to evacuate the vacuum chamber, for a predetermined amount of time, until a vacuum chamber pressure reaches a required pressure for evaporation, the vacuum chamber pressure being monitored by a pressure sensor;
disconnecting the vacuum pump from the vacuum chamber after the vacuum chamber pressure reaches the required pressure for evaporation;
carrying out a vacuum evaporation treatment with an evaporation device by heating the anti-soiling coating composition such that the anti-soiling coating composition is evaporated in the vacuum chamber to recoat the optical article with the anti-soiling coating composition;
reconnecting the vacuum pump to the vacuum chamber to evacuate gases emitted during the vacuum evaporation treatment from the vacuum chamber to the filtering device;
filtering the gases emitted during the vacuum evaporation treatment at the filtering device;
disconnecting the vacuum pump from the vacuum chamber after the filtering; and
unloading the optical article from the vacuum chamber,
wherein the vacuum chamber pressure for the required pressure for evaporation is different from a vacuum chamber pressure required for the plasma treatment.

16. The method according to claim 15, wherein the vacuum chamber pressure for the required pressure for evaporation is higher than the vacuum pressure required for the plasma treatment.

* * * * *